(12) United States Patent
Raynaud

(10) Patent No.: US 9,007,768 B2
(45) Date of Patent: Apr. 14, 2015

(54) SYSTEM FOR THERMALLY CONTROLLING AN APPARATUS

(75) Inventor: Martin Raynaud, Colombes (FR)

(73) Assignee: Thales, Courbevoie (FR)

( * ) Notice: Subject to any disclaimer, the term of this patent is extended or adjusted under 35 U.S.C. 154(b) by 303 days.

(21) Appl. No.: 13/394,448

(22) PCT Filed: Sep. 3, 2010

(86) PCT No.: PCT/EP2010/062938
§ 371 (c)(1),
(2), (4) Date: Mar. 6, 2012

(87) PCT Pub. No.: WO2011/029778
PCT Pub. Date: Mar. 17, 2011

(65) Prior Publication Data
US 2012/0176748 A1 Jul. 12, 2012

(30) Foreign Application Priority Data
Sep. 8, 2009 (FR) ...................................... 09 04273

(51) Int. Cl.
H05K 7/20 (2006.01)
H01L 23/34 (2006.01)
H01L 23/427 (2006.01)

(52) U.S. Cl.
CPC ............ H05K 7/20381 (2013.01); H01L 23/34 (2013.01); H01L 23/427 (2013.01); H05K 7/20309 (2013.01); H01L 2924/0002 (2013.01)

(58) Field of Classification Search
USPC ....................... 361/675–678, 679.46–679.54, 361/688–723, 752, 831
See application file for complete search history.

(56) References Cited

U.S. PATENT DOCUMENTS

| 6,085,831 | A  | * | 7/2000  | DiGiacomo et al. ...... 165/104.33 |
| 8,081,460 | B2 | * | 12/2011 | Ishida et al. ................... 361/700 |
| 8,194,406 | B2 | * | 6/2012  | Campbell et al. ............. 361/698 |
| 8,351,206 | B2 | * | 1/2013  | Campbell et al. ............. 361/700 |
| 2005/0286227 | A1 |   | 12/2005 | Erturk et al. |
| 2007/0193300 | A1 | * | 8/2007  | Tilton et al. ..................... 62/475 |

FOREIGN PATENT DOCUMENTS

JP 59-94445 A1 5/1984

* cited by examiner

Primary Examiner — Courtney Smith
(74) Attorney, Agent, or Firm — Baker Hostetler LLP

(57) ABSTRACT

A system for cooling items of equipment likely to give off energy, comprises: an enclosure comprising a membrane that is porous to water vapor and sealed to liquid water, said membrane separating the cavity into a first portion designed to contain a fluid consisting of water and vapor, a second portion designed to contain the vapor resulting from the vaporization of the water, a temperature sensor for measuring the temperature of the liquid-vapor fluid contained in the cavity, a device to discharge the vapor from the cavity into the environment creating a vacuum in this cavity and breaking the natural liquid/vapor balance of the cavity containing the liquid, thus causing a vaporization of a portion of the liquid, a means for controlling the flow rate of the vapor discharged to outside of the cavity, said control means being regulated on the signal delivered by the temperature sensor.

18 Claims, 2 Drawing Sheets

SYSTEM FOR THERMALLY CONTROLLING AN APPARATUS

CROSS-REFERENCE TO RELATED APPLICATIONS

This application is a National Stage of International patent application PCT/EP2010/062938, filed on Sep. 3, 2010, which claims priority to foreign French patent application No. FR 0904273, filed on Sep. 8, 2009, the disclosures of which are incorporated by reference in their entirety.

FIELD OF THE INVENTION

The subject of the invention is a system making it possible to thermally control a housing, one or more elements, one or more components or any device giving off heat with which it is placed in contact. The heat may be given off continuously or intermittently.

The invention is applied for cooling said aforementioned elements during their operation. It is applied to any type of element, in particular to elements of small size, such as electronic components or housings containing components.

BACKGROUND

All electrical or electrochemical devices in operation are the source of losses of energy that are manifested in the form of heat. Miniaturization, notably of items of electronic equipment, combined with the increase in dissipated power, require an increasingly elaborate thermal design of these devices in order to keep the temperature of the components in their range of operating tolerances. Outside certain temperature limits, their performance is mediocre or even totally lacking. Moreover, certain items of equipment must operate in hot and sunny climates and do this without making use of sources of external active cooling. The evacuation of heat is therefore a crucial problem, each element or device having to be kept at its nominal operating temperature. Thus, faced with the increase in the thermal power dissipated per unit of surface area, there is currently a need for compact and robust systems making it possible to absorb the peaks of thermal load so that the items of equipment do not exceed the maximum admissible temperatures. These systems are called thermal dissipation systems.

There are currently many solutions based essentially on active cooling systems: mini heat pump operating according to a refrigeration cycle, chamber with water circulation with or without change of phase, fan, thermoelectric module, etc. Microjets of air or of water droplets are instead dedicated to the cooling of the components and not of the systems.

Despite the performance that they provide, these devices nevertheless have the following drawbacks. Most of these devices require an external energy source, they are relatively bulky or even noisy and their miniaturization proves to be fragile and often accompanied by a deterioration in their efficiency.

Passive operation based on solid/liquid phase-change materials (abbreviated to PCM) (paraffins, etc.) is currently experiencing strong growth, but mainly in the fields of construction and industrial processes. Their effectiveness is however limited due to the moderate value of the latent heat (approximately 180 J/g) and above all because the melting temperature cannot be controlled in dynamic operation. Specifically, it depends on the PCM material used. PCMs damp down the temperature variations but they are above all well suited to the very large and large systems for which the constraints of volume or of weight are limited or even nonexistent.

SUMMARY OF THE INVENTION

The subject of the present invention is based on the combination of technical solutions assembled and controlled so as to obtain a thermal control system or thermal dissipation system that is standalone, passive, compact in certain cases, has no environmental impact and has little volume relative to the dissipated power.

The subject of the present invention is a system for cooling housings or items of equipment likely to give off energy, characterized in that it comprises at least the following elements: an enclosure comprising a membrane that is sealed to a liquid and porous to the vapor of said liquid, said membrane separating the enclosure into a first cavity designed to contain a fluid consisting of a liquid and its vapor, a second cavity designed to contain the vapor resulting from the vaporization of the liquid, a temperature sensor suitable for measuring the temperature of the liquid-vapor fluid contained in the cavity or the wall temperature of the cavity, a device that will make it possible to discharge the vapor from the cavity into the environment creating a vacuum in this cavity and breaking the natural liquid/vapor balance of the cavity containing the liquid, thus causing a vaporization of a portion of the liquid, a means for controlling the flow rate of the vapor discharged to the outside of the cavity, said control means is regulated on the signal delivered by the temperature sensor.

The liquid of the cavity is for example water, and the vapor is water vapor.

The cavity designed to contain the fluid consisting of liquid and vapor comprises, for example, a hygroscopic material or a material with high capillarity.

The device for discharging the vapor to the outside of the cavity may be a pump, or a gas/vapor micro-pump.

The cavity comprising the liquid-vapor fluid has for example a surface $S_5$, $S_{20}$ placed in contact with a surface $S_1$ of a device to be cooled, said surface $S_5$, $S_{20}$ in contact with the item of equipment being totally or partially covered with a hydrophilic porous material.

The membrane is placed for example in a vertical position, and the cavity containing the fluid is in contact with the device to be cooled.

The membrane may also be placed in a horizontal position and the two abovementioned cavities are in contact with a wall of an element to be cooled.

The cavity comprising the liquid is provided with an orifice allowing the addition of liquid and with a sensor Cn for sensing the liquid level.

The cavity containing the fluid is, for example, provided with cellulose, either a good heat-conducting capillary foam, or may be ribbed provided with fins, thus ensuring the correct thermal operation of the device irrespective of its inclination.

The system is, for example, used to cool a housing containing electronic components or electrochemical components.

BRIEF DESCRIPTION OF THE DRAWINGS

Other features and advantages of the device according to the invention will appear more clearly on reading the following description of an exemplary embodiment, given as an illustration and being in no way limiting, appended to the figures which represent.

DETAILED DESCRIPTION

In order to make it easier to understand the principle of the device according to the invention of which one of the objectives is to cool components, items of equipment or any other device likely to give off heat, the following description is given as an illustration and is in no way limiting for the cooling of an item of equipment likely to give off power and therefore heat continuously or intermittently. In the example given that is in no way limiting, the liquid used is water. However, without departing from the context of the invention, any fluid or mixture of fluids having great latent vaporization heat and a saturation pressure curve according to the temperature suitable to the operating conditions of the system to be cooled could be used. Typically, all refrigerating fluids that are not harmful and have slight environment impact can be used.

Figure 1:
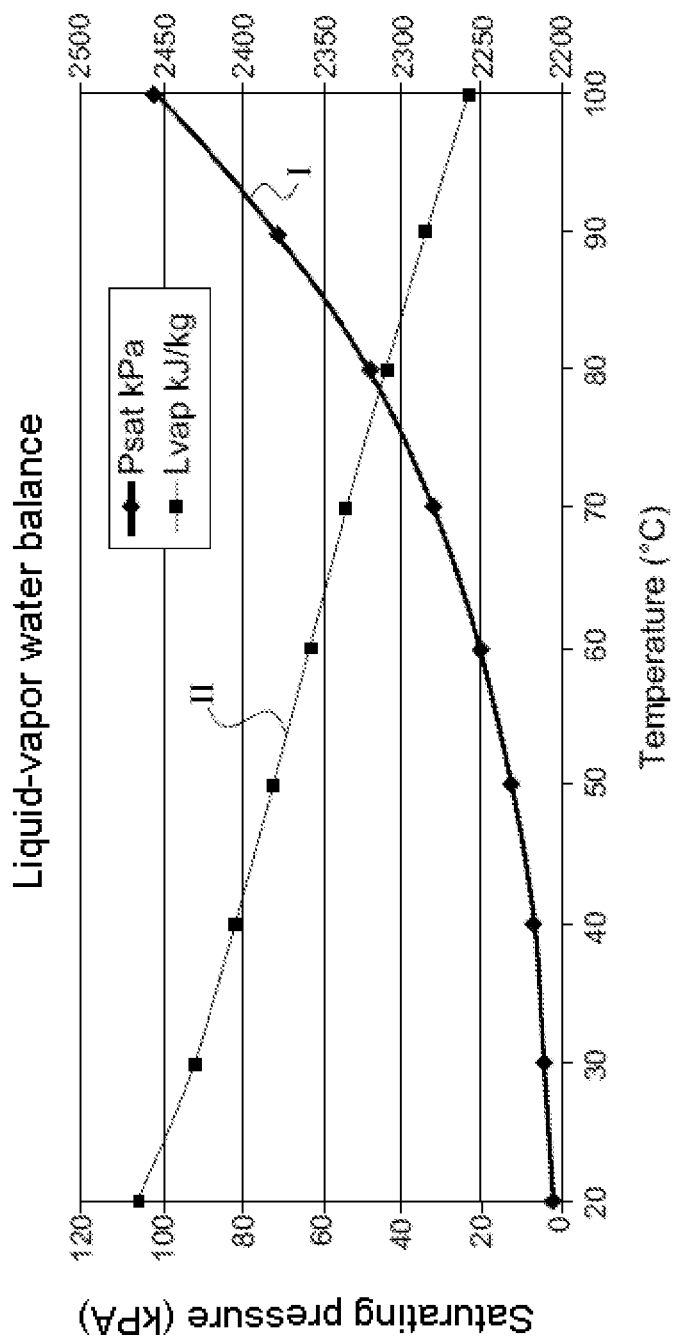
FIG. 1 represents the liquid-vapor water balance diagram.

FIG. 1 summarizes in a temperature-pressure diagram the water-vapor balance diagram, with the saturation pressure curve I and the latent vaporization heat curve II of the water.

In a closed enclosure, such that the partial vapor pressure P is below the saturation pressure (which is a function of the temperature T), the water is vaporized by drawing energy from the environment, that is to say in the case of the present example, either in liquid water, or at the item of equipment to be cooled, until the partial pressure of the vapor is equal to the saturation pressure.

Figure 2:
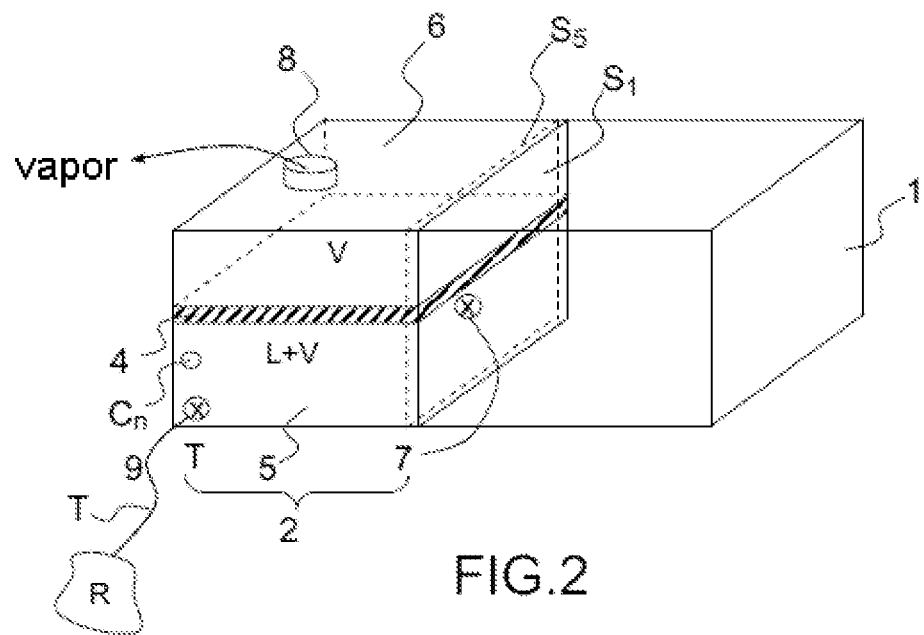
FIG. 2, a schematic diagram of cooling a device by evaporation.

FIG. 2 shows a first exemplary embodiment of the invention comprising for example a device 1 to be cooled which dissipates energy (intermittently or continuously) and which is placed in contact with a thermal control system or thermal dissipation system 2 according to the invention.

The thermal control system according to the invention consists of an enclosure or cavity 3 comprising a membrane 4 that is porous to water vapor and sealed to liquid water, in the example given in which the fluid used is water, said membrane separating the enclosure into two portions 5, 6 or cavities. A first cavity 5 contains fluid consisting of water and vapor, a second cavity 6 will contain water vapor only. The liquid water of the cavity 5 is vaporized according to the curve I of FIG. 1, the temperature of the cavity 5 being influenced by the heat dissipation produced by the item of equipment to be cooled. A temperature sensor 7 suitable for measuring either the temperature of the liquid-vapor fluid contained in the cavity or reserve 5, or the temperature of the wall of the enclosure 3 in contact with the device to be cooled. The temperature sensor 7 is connected to a pump 8 which will make it possible to discharge into the environment the water vapor from the cavity 6 creating a vacuum and, because of the permeability of the membrane 4 to the water vapor, breaking the natural liquid/vapor balance of the cavity 5, thus causing a vaporization of a portion of the liquid water. The cavity 5 is provided with an orifice 9 allowing the insertion of liquid either directly, or by means of a pipe T connected to a reservoir R of liquid. The cavity 6 comprises a means for evacuating vapor to the outside which, in the example given in FIG. 2, is the pump 8. When the temperature sensor 7 detects or measures a temperature value higher than a threshold value Vs or tolerance value at which the device will no longer operate correctly, a signal is transmitted to the pump 8 so that it starts up to evacuate water vapor that is generated in the cavity 6.

The membrane 4 that is porous to water vapor and sealed to liquid water is placed horizontally in this exemplary embodiment. The permeability to water vapor and its impermeability to liquid water must be as great as possible. Typically, the Versapor R and Versapor TR membranes marketed by Pall Corporation, or the Gore protective vents (series VE4 to VE8) adhesive membranes marketed by Gore meet these specifications. This membrane prevents liquid water being aspirated by the pump allowing the device to operate horizontally, vertically or in any other position. This membrane may be replaced by any other liquid-gas state separating device.

Control of the pump 8 makes it possible to regulate the flow rate for discharging water vapor into the environment, therefore indirectly the flow rate of vaporization of the water and thereby the power absorbed from the item of equipment to be cooled. The evacuation of water vapor from the cavity 6 to the environment causes the vaporization of the liquid water of the cavity 5, a vaporization which influences the temperature of the cavity 5. Depending on the energy balance of the cavity 5: the energy originating from the device to be cooled which passes through the wall of the enclosure 3 in contact with the device to be cooled—energy lost by the vaporization of the water, the temperature of the cavity 5 may remain higher or descend below the threshold value Vs for operation of the pump 8. The on/off system of the pump 8 is therefore controlled by the temperature sensor 7. Controlling the operation of the pump 8 by the sensor 7 makes it possible to trigger the vaporization of the liquid water in the cavity 5 without the water temperature reaching 100° C. (boiling temperature of the water under atmospheric pressure, thus allowing an effective cooling and therefore a control of the temperature of the item of equipment. The evaporation of the water in the cavity 5 is virtually instantaneous. Thus, the time constant of the system according to the invention may be extremely slight. This time constant depends on the operating curve (flow rate-pressure) of the pump 8, on the permeability of the membrane and on the thermal exchange through the wall of the item of equipment and the wall of the cavity.

The pump may be actuated as soon as the control temperature (liquid water or wall of the item of equipment) exceeds a threshold value Vs. The lower this value Vs, the greater the latent vaporization heat and hence the greater the energy absorbed by the liquid contained in the cavity 5. If the pump 8 is not actuated, the liquid water slows the increase in temperature of the system, solely on the basis of its sensitive heat (4.18 J/g° C.). If the pump 8 is stopped and in the open position so that the cavity 6 is at atmospheric pressure, the evaporation flow rate of the liquid water of the cavity 5 will be a function of its temperature (of the water) and the relative humidity of the environment.

The size of the cavity 5 is calculated so that the reserve of liquid water is sufficient to fully absorb energy given off throughout the period of operation of the item of equipment the temperature of which is controlled. A rapid temperature increase signaled by the temperature sensor 7 indicates that all the liquid water has been vaporized and that it is necessary to add water through the orifice provided for this purpose.

According to one variant embodiment, a wall of the device to be cooled is used as a wall to the cavity containing the liquid. In this case, either the system is incorporated into the device to be cooled and no longer added to the device to be cooled, or it is added to the device. In the latter case, coupling and sealing means are provided as a consequence and the liquid is inserted into the cavity once the device of which the object is to cool the item of equipment is associated with said item of equipment.

The system according to the invention may also operate continuously provided that the cavity 5 can be fed with water through the orifice 9 connected to the pipe T provided for this purpose, either continuously, or intermittently when the water level in the cavity 5 becomes too low. The liquid level may be determined by virtue of a level sensor Cn for sensing liquid in the cavity 5. This level sensor may be mechanical, visual or any other means allowing the liquid level to be detected. The sensor may be connected to a device not shown in the figure which allows an automatic triggering of the filling with liquid when the threshold level is not reached.

The pump 8 must be suited to the power dissipated by the item of equipment to be cooled and must have reduced electrical consumption. It may be a piezometric micro-pump with a very low flow-rate diaphragm (micro-pump MDP2205 marketed by ThinXXS), with a low flow rate (rotary micro-pump SP135 FZ or eccentric micro diaphragm pump SP100EC or micro piston pump SP625PI marketed by Schwarzer Precision) or any other pumping means suitable for the maximum flow-rate and vacuum values necessary to the correct operation of the invention.

In order to even out the temperature in the cavity 5 and to promote the transfer of heat at the wall of the item of equipment, the first cavity 5 designed to contain liquid water, or a fluid consisting of liquid water and vapor may contain either cellulose, or a good heat-conducting capillary foam, or may be ribbed or furnished with fins, thus ensuring the correct thermal operation of the device irrespective of its inclination. The internal surface of the cavity 5 in contact with the item of equipment may also advantageously be fully or partially covered with a hydrophilic porous material. This wall must be made of good heat-conducting material whereas the other walls of the cavity 5 will advantageously be poor conductors of heat.

There is no specific constraint relating to the volume and the composition of the walls of the cavity 6, nevertheless the surface of the membrane must be as large as possible in order to make the movement of the water vapor from the cavity 5 to the cavity 6 easier. A membrane pump could be an integral part of this cavity.

Figure 3:
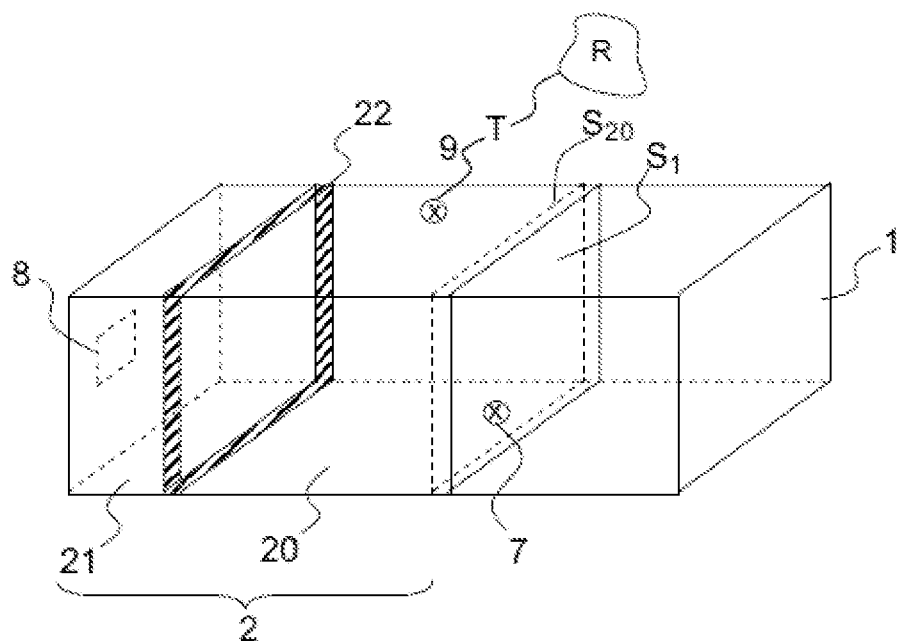
FIG. 3, a variant embodiment of the device of FIG. 2.

FIG. 3 represents a variant embodiment offering notably a larger exchange surface with an item of equipment 1 to be cooled. In this example, the cavity 20 containing the fluid consisting of water and vapor is placed in contact with the item of equipment 1 that is to be cooled and that dissipates energy intermittently (or not). The values of the surface $S_{20}$ of the cavity 20 and of the surface $S_1$ in contact with the item of equipment to be cooled are, for example, substantially equal in order to ensure a more even dissipation of energy from the equipment to be cooled. This equality in the values is however not indispensable, and it is possible to find thermal control systems which will have a smaller surface placed in contact with the item of equipment to be cooled than the surface of the item of equipment itself. There is also a membrane 22 that is porous to water vapor and sealed to liquid water, said membrane separating the cavity into two portions or cavities 20, 21. The cavity 21 containing the vapor obtained by the dissipation of energy from the device to be cooled is discharged to the outside in the same way as in the case of FIG. 2. A temperature sensor 7 suitable for measuring the temperature of the liquid-vapor fluid contained in the cavity or reserve 21 or the temperature of the wall separating the item of equipment 1 and the cavity 20 is connected to a pump 8, will make it possible to discharge into the environment the water vapor of the tank creating a vacuum and breaking the natural liquid/vapor balance of the tank containing the liquid water, thus causing a vaporization of a portion of the liquid water. As in the example of FIG. 2, the cavity 20 is provided with an orifice 9 allowing the addition of liquid and with a liquid-level sensor which may be visual or mechanical.

The idea of the present invention lies on the one hand in the use of the latent evaporation heat of the water as a heat sink and on the other hand in the control of the vapor pressure. This vaporization requires energy, in the case of water of the order of 2 200 J/g. This energy is taken from the liquid water and from its tank which has the effect of lowering the temperature of the water thus creating a flow of heat from the item of equipment to the tank or device according to the invention. This cold zone at the liquid water makes it possible to lower the temperature of the housing of the item of equipment, hence to lower the temperature of the electronic components or other elements dissipating heat but which must be kept at low temperature. The thermal design of the whole device to be cooled and thermal control system according to the invention must be adapted on a case-by-case basis in order to optimize the heat exchanges. For example, the wall between the item of equipment 1 and the cavity containing the liquid or the liquid-vapor fluid 20 could be the condenser of a heat pipe, the evaporator of the heat pipe itself being in contact with the element or the elements that dissipate the energy. The energy dissipated by the item of equipment will be absorbed by the liquid water after conveyance by the heat pipe. With respect to change of liquid/vapor phase, the flow of heat between the element or elements comprising and the liquid water may be very great (more than 1 W/cm$^2$) while maintaining a very slight temperature difference (a few degrees) between these two elements.

In order to illustrate the operation of the system according to the invention, a numbered example is given below.

Assume an eccentric micro diaphragm pump making it possible to pump 0.6 l/min of water vapor at 60° C. in the cavity (6) and consuming an electrical power of 0.3 W. The pumping of the water vapor in the cavity (6) causes an evaporation of 0.08 g/min of liquid water, which represents an absorbed power of 3 W. Thus a cavity (5) of 16 cm$^3$ initially filled with liquid water will be equivalent to a heat sink that can absorb 2.7 W for more than 3 hours. The overall volume of the system according to the invention, micro-pump included, is of the order of 50 cm$^3$.

ADVANTAGES

The cooling system according to the invention notably makes it possible to obtain a large capacity of energy transfer for a limited volume and a low electrical consumption. Consequently, it is possible to manage high thermal powers for a low space requirement, which is not the case with the cooling systems known to the Applicant. This system may either be incorporated into the housing to be cooled, or designed as an optional element that would be mounted onto the housing when the operating conditions require.

The invention claimed is:

1. A system for cooling housings or items of equipment likely to give off energy, comprising:
    an enclosure comprising a membrane that is sealed to a liquid and porous to the vapor of said liquid, said membrane separating the enclosure into a first cavity to contain a fluid consisting of said liquid and its vapor, a second cavity to contain the vapor resulting from the vaporization of the liquid,
    a temperature sensor suitable for measuring the temperature of the liquid-vapor fluid contained in the first cavity or the wall temperature of the first cavity, a device that will make it possible to discharge the vapor from the second cavity into the environment creating a vacuum in the second cavity and breaking the natural liquid/vapor balance within the first cavity containing the liquid, thus causing a vaporization of a portion of the liquid, a means for controlling the flow rate of the vapor discharged to the outside of the second cavity, said control means being regulated by a signal delivered by the temperature sensor, wherein the first cavity comprises a hygroscopic material or a material with high capillarity.

2. The system as claimed in claim 1, wherein the liquid is water, and the vapor is water vapor.

3. The system as claimed in claim 1, wherein the device for discharging the vapor to the outside of the second cavity is a pump, or a gas/vapor micro-pump.

4. The system as claimed in claim 1, wherein the cavity comprising the liquid-vapor fluid has a surface $S_5$, $S_{20}$ placed in contact with a surface $S_1$ of a device to be cooled, said surface $S_5$, $S_{20}$ in contact with the item of equipment being totally or partially covered with a hydrophilic porous material.

5. The system as claimed in claim 4, wherein the membrane is placed in a vertical position, and the cavity containing the fluid is in contact with the device to be cooled.

6. The system as claimed in claim 4, wherein the membrane is placed in a horizontal position and the first and second cavities and are in contact with a wall of an element to be cooled.

7. The system as claimed in claim 1, wherein the first cavity comprising the liquid is provided with an orifice allowing the addition of liquid and with a sensor for sensing the liquid level.

8. The system as claimed in claim 1, wherein the first cavity containing the fluid is provided with cellulose, a good heat-conducting capillary foam, or may be ribbed provided with fins, thus ensuring correct thermal operation of the device irrespective of its inclination.

9. The system as claimed in claim 1, wherein the device to be cooled is a housing containing electronic components or electrochemical components.

10. A system for cooling housings or items of equipment likely to give off energy, comprising:

an enclosure comprising a membrane that is sealed to a liquid and porous to the vapor of said liquid, said membrane separating the enclosure into a first cavity to contain a fluid consisting of said liquid and its vapor, a second cavity to contain the vapor resulting from the vaporization of the liquid, a temperature sensor suitable for measuring the temperature of the liquid-vapor fluid contained in the first cavity or the wall temperature of the first cavity, a device that will make it possible to discharge the vapor from the second cavity into the environment creating a vacuum in the second cavity and breaking the natural liquid/vapor balance within the first cavity containing the liquid, thus causing a vaporization of a portion of the liquid, a means for controlling the flow rate of the vapor discharged to the outside of the second cavity, said control means being regulated by a signal delivered by the temperature sensor, wherein the first cavity comprising the liquid-vapor fluid has a surface $S_5$, $S_{20}$ placed in contact with a surface $S_1$ of a device to be cooled, said surface $S_5$, $S_{20}$ in contact with the item of equipment being totally or partially covered with a hydrophilic porous material.

11. The system as claimed in claim 10, wherein the liquid is water, and the vapor is water vapor.

12. The system as claimed in claim 10, wherein the first cavity comprises a hygroscopic material or a material with high capillarity.

13. The system as claimed in claim 10, wherein the device for discharging the vapor to the outside of the second cavity is a pump, or a gas/vapor micro-pump.

14. The system as claimed in claim 10, wherein the membrane is placed in a vertical position, and the cavity containing the fluid is in contact with the device to be cooled.

15. The system as claimed in claim 10, wherein the membrane is placed in a horizontal position and the first and second cavities and are in contact with a wall of an element to be cooled.

16. The system as claimed in claim 10, wherein the first cavity comprising the liquid is provided with an orifice allowing the addition of liquid and with a sensor for sensing the liquid level.

17. The system as claimed in claim 10, wherein the first cavity containing the fluid is provided with cellulose, a good heat-conducting capillary foam, or may be ribbed provided with fins, thus ensuring correct thermal operation of the device irrespective of its inclination.

18. The system as claimed in claim 10, wherein the device to be cooled is a housing containing electronic components or electrochemical components.

\* \* \* \* \*